United States Patent [19]
Maeda

[11] Patent Number: 5,815,218
[45] Date of Patent: Sep. 29, 1998

[54] CIRCUIT DEVICE INCLUDING RF CONVERTER, TUNER AND IF AMPLIFIER

[75] Inventor: Osamu Maeda, Daito, Japan

[73] Assignee: Funai Electric., Ltd, Osaka, Japan

[21] Appl. No.: 582,625

[22] Filed: Jan. 4, 1996

[30] Foreign Application Priority Data

Jan. 4, 1995 [JP] Japan .................................. 7-000312 U
Apr. 14, 1995 [JP] Japan .................................. 7-004430 U

[51] Int. Cl.⁶ .................................. H04N 5/40; H04N 5/50
[52] U.S. Cl. .................. 348/724; 348/731; 455/196.1; 455/197.3; 455/198.1; 332/141
[58] Field of Search ................................. 348/10, 11, 738, 348/733, 724, 731, 736; 455/6.2, 188.2, 196.1, 197.2, 197.3, 198.1, 193.1, 193.2, 258, 318, 319, 320; 332/138, 141; 386/26, 46; 360/29, 30; H04N 5/40, 5/50

[56] References Cited

U.S. PATENT DOCUMENTS 3,611,154 10/1971 Kupfer ................................ 455/197.1
4,361,909 11/1982 Theriault ............................. 455/197.2
4,363,135 12/1982 Moon .................................... 455/188
4,418,427 11/1983 Muterspaugh ...................... 455/188.2
4,921,465 5/1990 Hietala et al. ..................... 455/195.1
5,038,405 8/1991 Karr .................................. 455/197.1
5,212,828 5/1993 Hatashita et al. ..................... 455/295
5,327,582 7/1994 Wong ................................. 455/196.1
5,535,443 7/1996 Wignot .............................. 455/196.1

Primary Examiner—John K. Peng
Assistant Examiner—Jeffrey S. Murrell

[57] ABSTRACT

A circuit device provided in a video signal processing apparatus. The circuit device includes a tuner for tuning a television signal, an IF amplifier for demodulating the television signal, and an RF converter having an RF oscillator for modulating video and audio signals into a television signal in a VHF band. The tuner, IF amplifier and RF converter are accommodated in a shield case. Further, the circuit device includes a circuit including a resonance circuit having a coil and a capacitor for controlling an oscillation frequency of the RF oscillator and a switch for switching a parameter of the resonance circuit to vary the oscillation frequency.

9 Claims, 3 Drawing Sheets

CIRCUIT DEVICE INCLUDING RF CONVERTER, TUNER AND IF AMPLIFIER

BACKGROUND OF THE INVENTION

1. Field of the Invention

The present invention relates to a circuit device including an RF converter, a tuner and an IF amplifier which is used in a video signal processing apparatus.

2. Description of the Related Art

FIG. 5 shows an example of a block circuit of a circuit device in which an RF converter, a tuner and an IF amplifier are accommodated in a shield case 70, the circuit device being used in a video recording apparatus which is a video signal processing apparatus, such as a video tape recorder (VTR).

In FIG. 5, reference numeral 71 designates an RF converter circuit block including an antenna circuit 74 and an RF converter circuit 6. The antenna circuit 74 serves to supply a television signal from an antenna input connector (ANT-IN) 76 to a tuner circuit block 72 at the subsequent stage and also supply the television signal to a television output connector (TV-OUT) 77 in accordance with a control signal A of the video recording apparatus body (not shown). The RF converter circuit 6 serves to convert video and audio signals B introduced from the video recording apparatus body into a predetermined television signal to be output from the television output connector 77 through the antenna circuit 74.

Reference numeral 72 designates the tuner circuit block including an RF amplifier circuit 78 for amplifying the television signal, and a mixer circuit 79 for converting the amplified television signal into an intermediate frequency (IF) signal by a local oscillator circuit 80.

Reference numeral 73 designates an IF circuit block including an IF band limiting circuit 81, i.e., an IF filter circuit, and an IF amplifying/detecting circuit 82 for amplifying and detecting the filtered IF signal.

FIG. 3 is a view for explaining the schematic configuration of the RF converter circuit 6 shown in FIG. 5. Specifically, FIG. 3 shows the conventional RF converter circuit for the VHF band, having an RF oscillator (RF carrier oscillator), for modulating the received video and audio signals B reproduced using a rotary head and an audio head from a magnetic tape which is a recording medium of a VHS system video tape recorder (VTR) into a television signal to be supplied to a television receiver.

The video and audio signals reproduced by the video tape recorder are modulated into a predetermined television signal on the basis of an oscillation signal from an RF oscillator 7. The RF oscillator 7 determining the modulated frequency is usually adapted to be capable of selecting one of a plurality of channel frequencies in the VHF band.

The RF converter circuit 6 is used for the purpose of causing the channel at which broadcasting is carried out to be not equal to the channel of the signal produced from the video tape recorder because the channels of broadcasting are different from each other for local areas.

A channel switch 10 is used to select the channel frequency. The channel switch 10 controls the RF oscillator 7 connected to a SAW type resonator 11 to determine the channel frequency.

FIG. 4 shows an example of the conventional RF converter circuit 6 for the UHF band, having an RF oscillator for the UHF band. Specifically, FIG. 4 is a circuit diagram showing the configuration of the RF converter circuit 6 connected to a resonance circuit 21 for the RF oscillator 7 which can frequency-modulate the video and audio signals B reproduced from the magnetic tape in a video tape recorder. The resonance circuit 21 includes a variable capacitor (which is an air capacitor) 22 for varying the resonance frequency of the circuit 21.

The conventional RF converters are configured as described above. The former VHF band RF converter has disadvantages of a large mounting space and a manufacturing cost increased due to the highest of the SAW type resonator 11. The latter UHF band RF converter also has disadvantages of a large space requirement mounting the variable capacitor for frequency conversion of a video signal and increased manufacturing cost

SUMMARY OF THE INVENTION

The present invention has been accomplished to solve the above problems, and has an object to provide a circuit device including an RF converter, a tuner and an IF amplifier which can reduce the mounting space and the manufacturing cost.

In order to attain the above object, the first aspect of the present invention provides a circuit device provided in a video signal processing apparatus, the circuit device comprising: a tuner for tuning a television signal; an IF amplifier for demodulating the television signal; an RF converter having an RF oscillator for modulating video and audio signals into a television signal in a VHF band; and a circuit comprising a resonance circuit including a coil and a capacitor for controlling an oscillation frequency of the RF oscillator and a switch for switching a parameter of the resonance circuit to vary the oscillation frequency.

Further, the second aspect of the present invention provides a circuit device provided in a video signal processing apparatus, the circuit device comprising: a tuner for tuning a television signal; an IF amplifier for demodulating the television signal; an RF converter having an RF oscillator for modulating video and audio signals into a television signal in a UHF band; and a circuit comprising a resonance circuit including a coil and a capacitor for controlling an oscillation frequency of the RF oscillator and a trimmer capacitor for varying a parameter of the resonance circuit to vary the oscillation frequency.

DETAILED DESCRIPTION OF THE PREFERRED EMBODIMENTS

Figure 1:
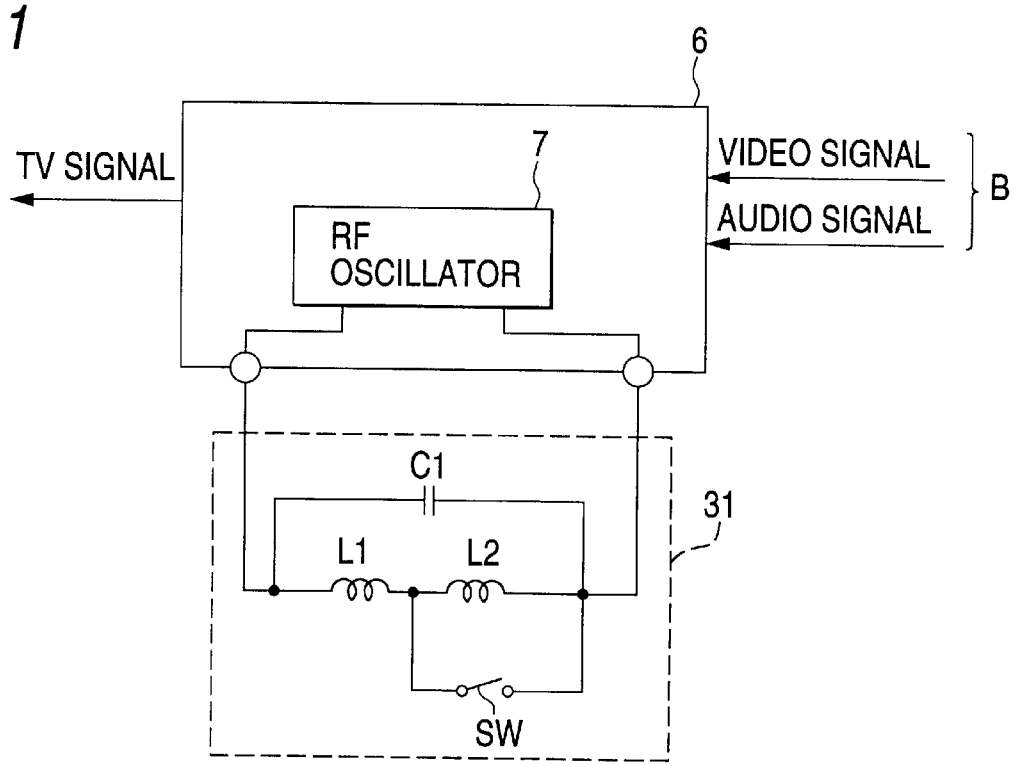
FIG. 1 is a circuit diagram showing the configuration of an RF converter for generating a television signal in the VHF band according to a first embodiment of the present invention.
Figure 5:
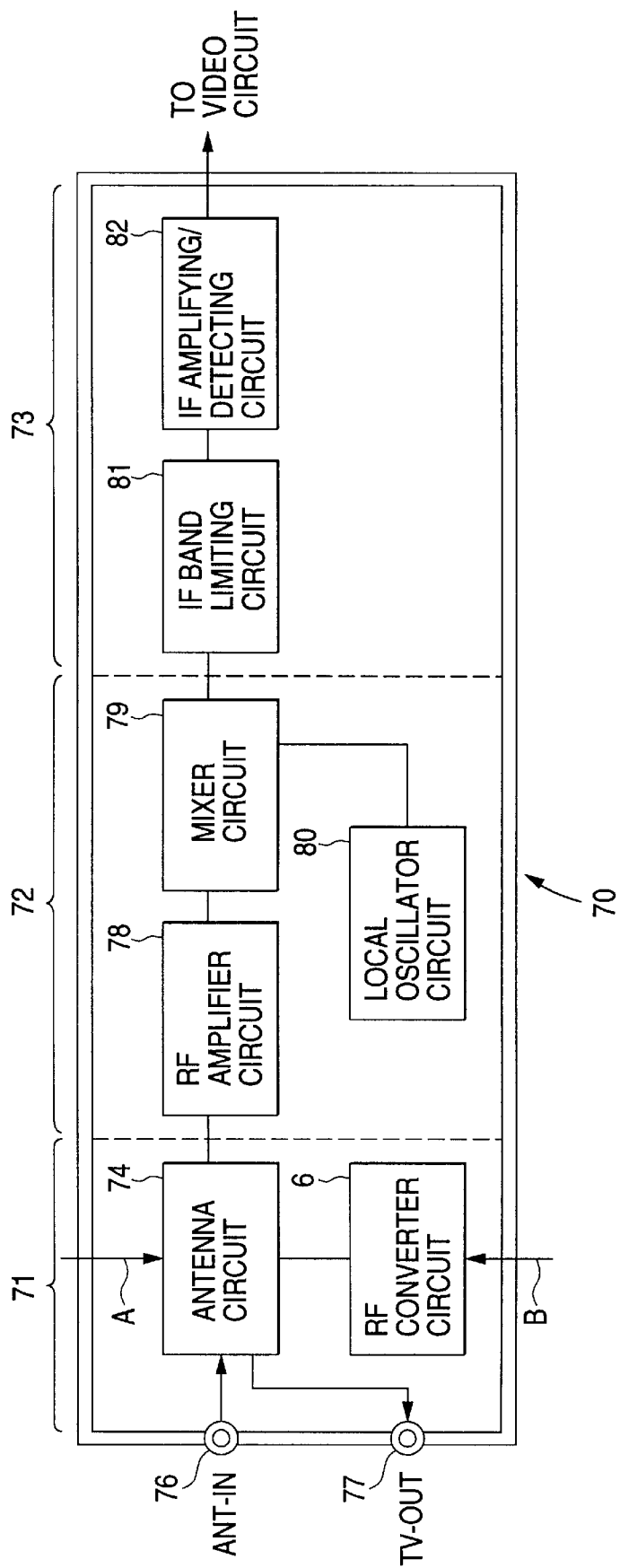
FIG. 5 is a block circuit diagram of a circuit device including an RF converter, a tuner and an IF amplifier which is used for a video tape recorder.

Hereinafter, the first embodiment of the present invention will be explained with reference to FIG. 1. FIG. 1 is a schematic explanation diagram of an RF converter circuit 6 for the VHF band in a circuit device including RF converter, tuner and IF amplifier according to the first embodiment of the present invention. In FIG. 1, the configuration other than the RF converter circuit 6, which is the same as that of FIG. 5, will not be explained here.

In FIG. 1, reference numeral 31 designates an LC resonance circuit connected to an RF oscillator 7. The LC resonance circuit 31 includes coils L1 and L2 connected in series and a capacitor C1 connected in parallel to these coils. Now, the coils L1 and L2 may be air-core coils and have inductances each fixed to a predetermined value by adjusting the entire length of the coil with a predetermined number of turns through its expansion and contraction. This adjustment process for the coils L1 and L2 does not significantly lengthen the entire adjustment process because it is the same working process as adjusting the inductances of a plurality of air-core coils for a tuner in the tuner circuit block 72 in the circuit device including RF converter, tuner and IF amplifier. Incidentally, an adjustment tank coil, which is used for audio modulation or the like, is of a CAN type for a lower frequency band than the VHF band, and is adjusted in an entirely different manner from that for the air-core coil. Namely, a magnet is inserted and moved into the center of the coil to adjust the inductance, thereby permitting the preset adjustment. Therefore, the adjustment tank coil is not used for the VHF band.

Further, the LC resonance circuit 31 has a switch SW which can short-circuit both ends of the coil L2. Although the switch SW is illustrated as an open/close switch, it may be a switch using a transistor, FET, diode or the like.

In the LC resonance circuit 31, turning on or off of the switch SW short-circuits both ends of the coil L2, or otherwise releases the short-circuited state. Thus, the resonance frequency of the LC resonance circuit 31 is varied to vary the carrier frequency of the RF oscillator 7. The same effect is obtained as the case where the carrier frequency of the RF oscillator 7 is varied by the channel switch 10 using the conventional SAW type resonator 11. Accordingly, the RF converter circuit block 71 can be designed in a compact configuration. The LC resonance circuit 31 does not require a specific and expensive SAW type resonator.

The frequency of the television signal output from the television output connector 77 of the circuit device including RF converter, tuner and IF amplifier must be adjusted to have a appropriate to the television signal specifications for each destination country in which the product is to be sold. For this reason, in the case where a specific and expensive SAW type resonator is used, the SAW type resonators suited to the specifications for each destination must be previously stored in preparation for shortage of supply. On the other hand, in the case of the present invention, since the parameters of L and C of the resonance circuit, which are inexpensive and simple components, have only to be varied, such consideration is not necessary.

Since the switch SW can be arranged in the proximity of the coil L2, the lengths of wirings for frequency exchange are greatly shortened, thus contributing to a miniaturized design. The circuit device including RF converter, tuner and IF amplifier to be provided in the video recording apparatus can be easily designed in a compact configuration, thus reducing the manufacturing cost.

Figure 2:
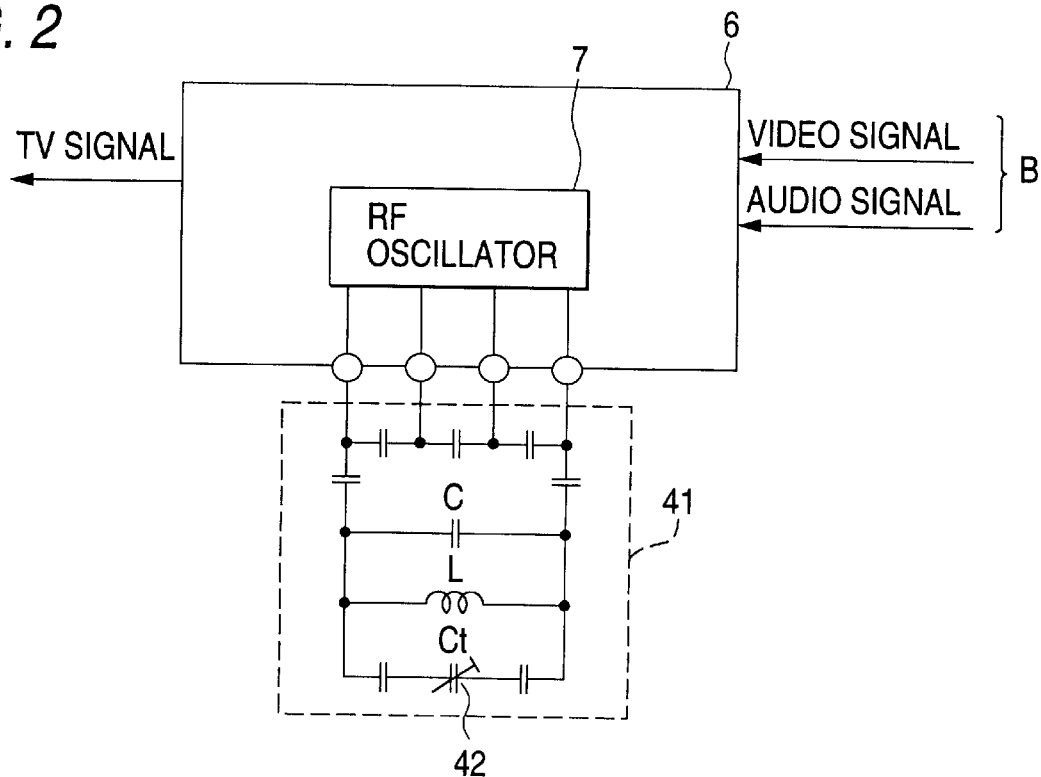
FIG. 2 is a circuit diagram showing the configuration of an RF converter for generating a television signal in the UHF band according to a second embodiment of the present invention.
Figure 3:
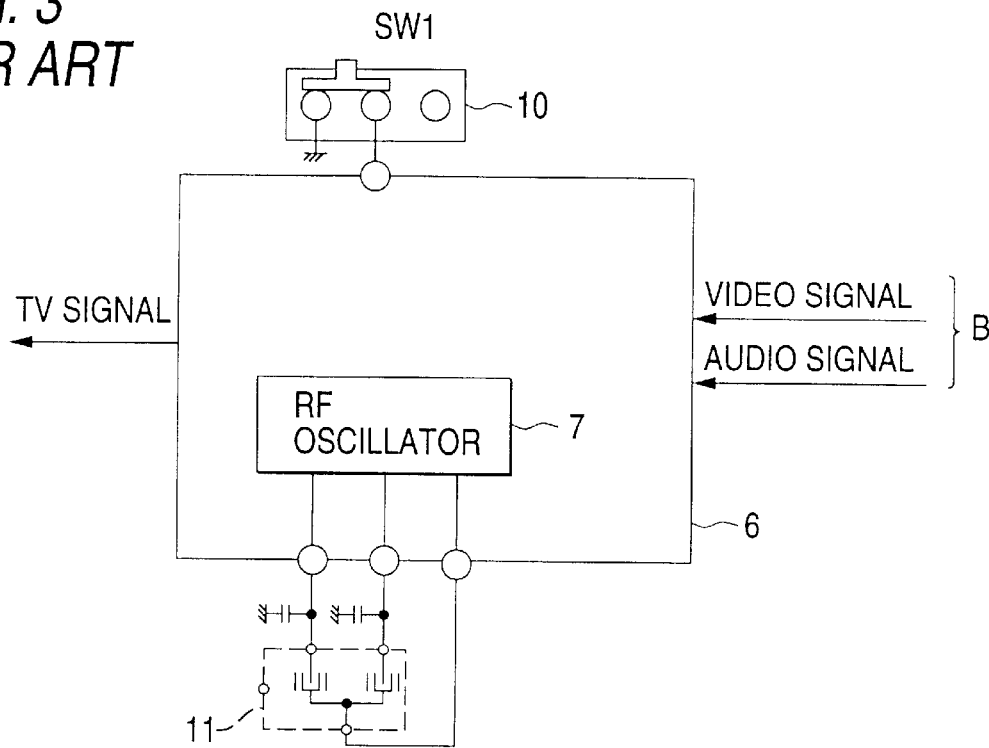
FIG. 3 is a circuit diagram showing the configuration of a conventional RF converter for generating a television signal in the VHF band.
Figure 4:
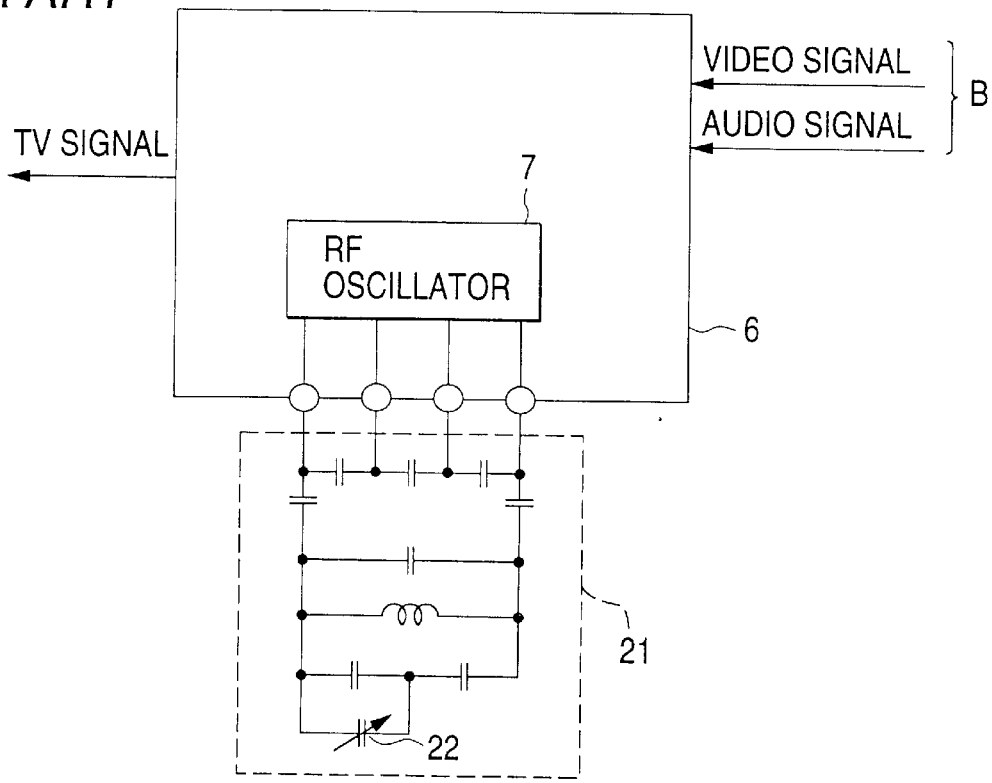
FIG. 4 is a circuit diagram showing the configuration of another conventional RF converter for generating a television signal in the UHF band.

Next, an explanation will be given of the second embodiment of the present invention. FIG. 2 is a partial circuit diagram of a resonance circuit connected to an RF oscillator 7 of an RF converter circuit 6 for the UHF band according to this embodiment. The remaining circuit part is the same as in FIG. 5. In FIG. 2, reference numeral 41 designates a resonance circuit connected to the RF oscillator 7. Reference numeral 42 designates a trimmer capacitor Ct such as a ceramic trimmer which is adjusted to vary the resonance frequency which is defined by a coil L and a capacitor C. Since the insulating material inserted between the electrodes of the trimmer capacitor Ct 42 has a higher dielectric constant than that of air, a short distance is permitted between the electrodes of the capacitor. This is more advantageous in a smaller mounting space and a more reduced manufacturing cost than the variable capacitor 22 shown in FIG. 4, i.e., an air capacitor.

Meanwhile, in the conventional circuit using a variable capacitor, although the variable capacitor used is bulky, it has high accuracy. For this reason, adjustment of the value on the coil side as a resonance circuit is not required. In the present invention, since a trimmer capacitor with low accuracy is used in place of such a variable capacitor, the value on the coil side is adjusted by expansion/contraction of the entire length of the air-core coil of the resonance circuit. This adjustment can minimize the variable range of the frequency of the resonance circuit required for the trimmer capacitor. Thus, the trimmer capacitor can be miniaturized to a necessary and minimum degree. The adjustment operation of the air-core coil, which is the same as that in the tuner as described in the VHF band, does not almost lengthen the entire adjustment process. Further, using a small-sized trimmer capacitor instead of a large-sized air variable capacitor reduces a floating capacitance, which is more advantageous in design of a resonance circuit in the UHF band with high frequencies, thus improving the reliability of the resonance circuit. This contributes to miniaturization and manufacturing cost reduction of the RF converter, i.e., the circuit device including RF converter, tuner and IF amplifier provided in a video recording apparatus which is a video signal processing apparatus.

In the circuit device including RF converter, tuner and IF amplifier for the VHF band according to the present invention, the resonator connected to the RF oscillator of the RF converter for generating a television signal in the VHF band is configured by a resonance circuit of an LC lumped parameter circuit. The circuit device is not required to use an SAW type resonator which is an expansive and specific component with a large mounting space and hence can be easily miniaturized.

The inductance value of the coil of the LC lumped parameter circuit can be adjusted using the same working process as in the adjustment of the air-core coil of the tuner section of the circuit device. Thus, the resonance circuit can be regulated with little lengthening of the adjustment process.

In many cases, the frequency of a television signal output from the circuit device as described above is different for each destination of a product. In this case, conventionally, specific and expensive SAW type resonators suited to the specification for each destination must be previously supplied and stored to make products. On the other hand, in the case of the present invention, the parameters of L and C of the resonance circuit which are inexpensive and simple components have only to be varied. This is a very meritorious effect of the present invention.

As described above, miniaturization of the circuit device including RF converter, tuner and IF amplifier for the VHF band permits a compact design of the video signal processing apparatus using the circuit device. This mainly suppresses the manufacturing cost of the entire video signal processing apparatus.

The circuit device including RF converter, tuner and IF amplifier for the UHF band is provided with a trimmer capacitor in place of the conventional accurate but bulky variable capacitor in order to vary the carrier frequency of the resonance circuit connected to the RF oscillator of the RF converter for generating a television signal in the UHF band. For this reason, miniaturization of the device and simplification on a circuit board can be realized. Further, the resonance circuit is apt to generate a variation in accuracy because the trimmer capacitor is used in place of the variable capacitor. In order to overcome this, the entire length of the air-core coil is adjusted as in the circuit device for the VHF band so that the frequency variable range of the resonance circuit by the trimmer capacitor is limited to a necessary and minimum range. This permits the trimmer capacitor to be miniaturized and hence the circuit device for the UHF band to be miniaturized and compacted.

Substitution of the small-sized trimmer capacitor for the large-sized variable capacitor of the resonance circuit of the circuit device for the UHF band according to the present invention serves to reduce the floating capacitance for the circumference greatly and contribute to a compact design remarkably.

As described above, miniaturization of the circuit device including RF converter, tuner and IF amplifier for the UHF band permits a compact design of the video signal processing apparatus using the circuit device. This mainly suppresses the manufacturing cost of the entire video signal processing apparatus.

What is claimed is:

1. A circuit device provided in a video signal processing apparatus, said circuit device comprising:
   a tuner for tuning a television signal and means for supplying a plurality of RF television signals from an antenna to the tuner via an antenna input terminal, said tuner being arranged to convert an RF television signal into an IF television signal;
   an IF amplifier for amplifying and demodulating the IF television signal to obtain a baseband video and for providing said baseband video signal to a video processing circuit;
   an RF converter for re-modulating the video signal output by the video processing circuit and outputting an RF modulated signal to an antenna circuit connected between the antenna input terminal and an antenna output terminal, said antenna circuit being arranged to receive an RF television signal from said antenna input terminal and the RF modulated signal from said RF converter, and to output a converted RF television signal to said output terminal and to the tuner in accordance with a control signal; and
   an RF oscillator circuit included in said RF converter for providing a VHF carrier which is modulated by the output of said video processing circuit, said oscillator circuit comprising a resonance circuit including at least one coil and a capacitor for controlling an oscillation frequency of the RF oscillator and a switch for shifting said oscillation frequency in order to shift from a first VHF carrier frequency to a second VHF carrier frequency; and wherein said antenna circuit, said tuner, said IF amplifier, and said RF converter are all accommodated in a shield case.

2. The circuit device according to claim 1, wherein said resonance circuit includes two coils connected in series, and wherein the capacitor is connected in parallel to the two coils, and wherein said switch short-circuits both ends of one of said two coils to shift to the second VHF carrier frequency from the first VHF carrier frequency.

3. The circuit device according to claim 1, wherein said at least one coil of said resonance circuit includes two coils connected in series, and wherein the capacitor is connected in parallel to the two coils.

4. The circuit device according to claim 3, wherein said switch short-circuits both ends of one of the two coils.

5. The circuit device according to claim 1, wherein said tuner, IF amplifier and RF converter are accommodated in a shield case.

6. A circuit device provided in a video signal processing apparatus, said circuit device comprising:
   a tuner for tuning a television signal;
   an IF amplifier for demodulating the television signal;
   an RF converter having an RF oscillator for modulating video and audio signals into a television signal in a UHF band; and
   a circuit comprising a resonance circuit including a coil and a capacitor for controlling an oscillation frequency of the RF oscillator and a trimmer capacitor for varying a parameter of said resonance circuit to vary the oscillation frequency.

7. The circuit device according to claim 6, wherein the coil, capacitor and trimmer capacitor are connected to each other in parallel.

8. The circuit device according to claim 6, wherein an insulating material having a higher dielectric constant than that of air is inserted between electrodes of said trimmer capacitor.

9. The circuit device according to claim 6, wherein said tuner, IF amplifier and RF converter are accommodated in a shield case.

* * * * *